United States Patent
Chong et al.

(10) Patent No.: US 11,121,300 B2
(45) Date of Patent: Sep. 14, 2021

(54) METHOD OF PRODUCING OPTOELECTRONIC SEMICONDUCTOR DEVICES AND OPTOELECTRONIC SEMICONDUCTOR DEVICE

(71) Applicant: OSRAM Opto Semiconductors GmbH, Regensburg (DE)

(72) Inventors: Chui Wai Chong, Prai (MY); Teng Hai Chuah, Bukit Mertajam (MY); Seong Tak Koay, Georgetown (MY); Adelene Ng, Bayan Lepas (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 16/615,909

(22) PCT Filed: Aug. 11, 2017

(86) PCT No.: PCT/EP2017/070501
§ 371 (c)(1),
(2) Date: Nov. 22, 2019

(87) PCT Pub. No.: WO2019/029830
PCT Pub. Date: Feb. 14, 2019

(65) Prior Publication Data
US 2021/0074894 A1 Mar. 11, 2021

(51) Int. Cl.
*H01L 33/62* (2010.01)
*H01L 33/32* (2010.01)
(Continued)

(52) U.S. Cl.
CPC .............. *H01L 33/62* (2013.01); *H01L 33/32* (2013.01); *H01L 33/44* (2013.01); *H01L 33/56* (2013.01);
(Continued)

(58) Field of Classification Search
CPC ......... H01L 33/62; H01L 33/32; H01L 33/44; H01L 33/56; H01L 2933/005; H01L 2933/0066
See application file for complete search history.

(56) References Cited

U.S. PATENT DOCUMENTS 10,242,974 B2 * 3/2019 Hoeppel ................ H01L 25/167
2011/0189481 A1 8/2011 Barthelmes et al.
(Continued)

FOREIGN PATENT DOCUMENTS

EP 2 549 330 A1 1/2013
JP 2012-216598 A 11/2012

OTHER PUBLICATIONS

"Hydrophobe," Wikipedia; https://en.wikipedia.org/wiki/Hydrophobe: pp. 1-5.
(Continued)

*Primary Examiner* — Mark W Tornow
(74) *Attorney, Agent, or Firm* — DLA Piper LLP (US)

(57) ABSTRACT

A method of producing optoelectronic semiconductor devices includes in the stated order: A) providing a semiconductor layer sequence on a transparent wafer, the semiconductor layer sequence including an active layer; B) applying electrical contact pads on a mounting face of the semiconductor layer sequence; C) coating the semiconductor layer sequence at the mounting face and/or on the electrical contact pads with a protective layer; D) dicing the semiconductor layer sequence and the wafer to form semiconductor chips with side faces; E) forming a casting body all around the semiconductor chips directly on the side faces, the protective layer having anti-wetting properties towards a material of the casting body; and F) dicing the casting body to the optoelectronic semiconductor devices, wherein the protective layer remains on the mounting face and/or on the (Continued)

electrical contact pads in the finished optoelectronic semiconductor devices.

14 Claims, 5 Drawing Sheets

(51) Int. Cl.
*H01L 33/44* (2010.01)
*H01L 33/56* (2010.01)

(52) U.S. Cl.
CPC  *H01L 2933/005* (2013.01); *H01L 2933/0066* (2013.01)

(56) References Cited

U.S. PATENT DOCUMENTS

| | | |
|---|---|---|
| 2011/0281124 A1 | 11/2011 | Barthelmes et al. |
| 2012/0193648 A1* | 8/2012 | Donofrio ............... H01L 33/44 257/88 |
| 2015/0333227 A1* | 11/2015 | Lee ..................... H01L 33/62 257/98 |
| 2016/0172554 A1* | 6/2016 | Basin ................... H01L 33/58 257/88 |
| 2017/0005079 A1* | 1/2017 | Hoeppel ........... H01L 31/02327 |
| 2017/0200873 A1* | 7/2017 | Nakabayashi ........ H01L 33/005 |

OTHER PUBLICATIONS

Olaf Kurtz et al., "Re-melting behaviorof tin coatings," Article in Galvanotechnik; https://www.researchgate.net/publication/286226068; Feb. 2013, pp. 1-16.

\* cited by examiner

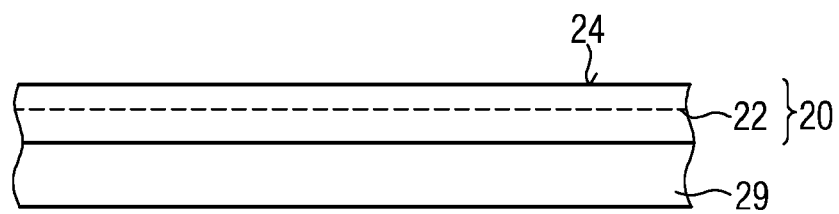
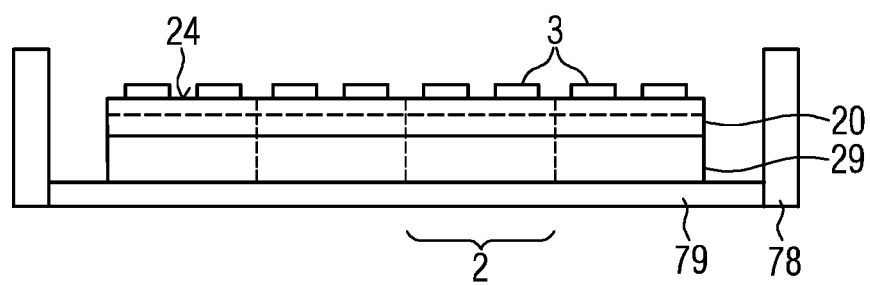
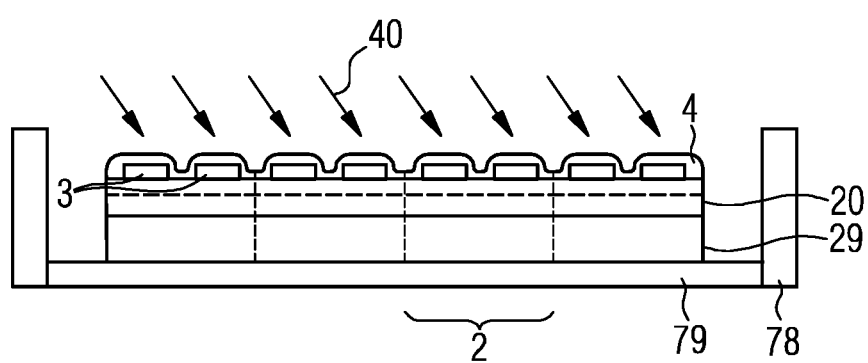

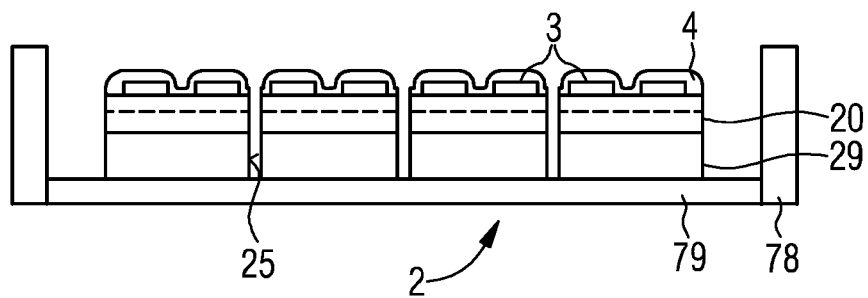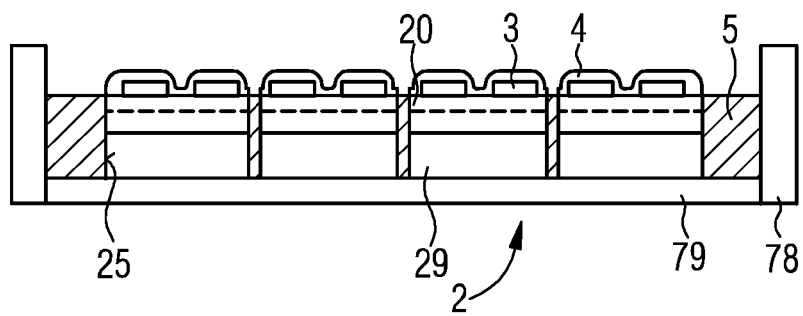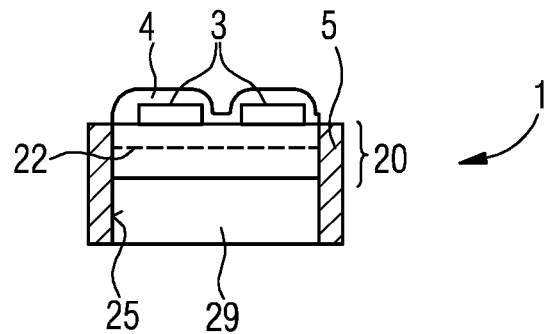

A)

B)

A)

B)

METHOD OF PRODUCING OPTOELECTRONIC SEMICONDUCTOR DEVICES AND OPTOELECTRONIC SEMICONDUCTOR DEVICE

TECHNICAL FIELD

This disclosure relates to a method of producing optoelectronic semiconductor devices and an optoelectronic semiconductor device.

BACKGROUND

There is a need to provide a method by which optoelectronic semiconductor devices can be produced with a high yield.

SUMMARY

We provide a method of producing optoelectronic semiconductor devices including in the stated order: A) providing a semiconductor layer sequence on a transparent wafer, the semiconductor layer sequence including an active layer; B) applying electrical contact pads on a mounting face of the semiconductor layer sequence; C) coating the semiconductor layer sequence at the mounting face and/or on the electrical contact pads with a protective layer; D) dicing the semiconductor layer sequence and the wafer to form semiconductor chips with side faces; E) forming a casting body all around the semiconductor chips directly on the side faces, the protective layer having anti-wetting properties towards a material of the casting body; and F) dicing the casting body to the optoelectronic semiconductor devices, wherein the protective layer remains on the mounting face and/or on the electrical contact pads in the finished optoelectronic semiconductor devices.

We also provide an optoelectronic semiconductor device produced by the method of producing optoelectronic semiconductor devices including in the stated order: A) providing a semiconductor layer sequence on a transparent wafer, the semiconductor layer sequence including an active layer; B) applying electrical contact pads on a mounting face of the semiconductor layer sequence; C) coating the semiconductor layer sequence at the mounting face and/or on the electrical contact pads with a protective layer; D) dicing the semiconductor layer sequence and the wafer to form semiconductor chips with side faces; E) forming a casting body all around the semiconductor chips directly on the side faces, the protective layer having anti-wetting properties towards a material of the casting body; and F) dicing the casting body to the optoelectronic semiconductor devices, wherein the protective layer remains on the mounting face and/or on the electrical contact pads in the finished optoelectronic semiconductor devices, including the substrate that is part of the diced wafer; the semiconductor layer sequence is on the substrate, the semiconductor layer sequence includes the active layer to produce ultraviolet or visible radiation, the semiconductor layer sequence and the substrate together form the semiconductor chip; the electrical contact pads on the mounting face of the semiconductor layer sequence are remote from the substrate; the hydrophobic protective layer is limited to the mounting face and/or to the electrical contact pads; the casting body is all around the semiconductor chip and directly on the side faces of the semiconductor chip, and the protective layer has anti-wetting properties towards the material of the casting body.

BRIEF DESCRIPTION OF THE DRAWINGS

FIGS. 1A-1F to 4A-4B are schematic sectional representations of method steps of a method to produce examples of optoelectronic semiconductor devices.

Figure 2:
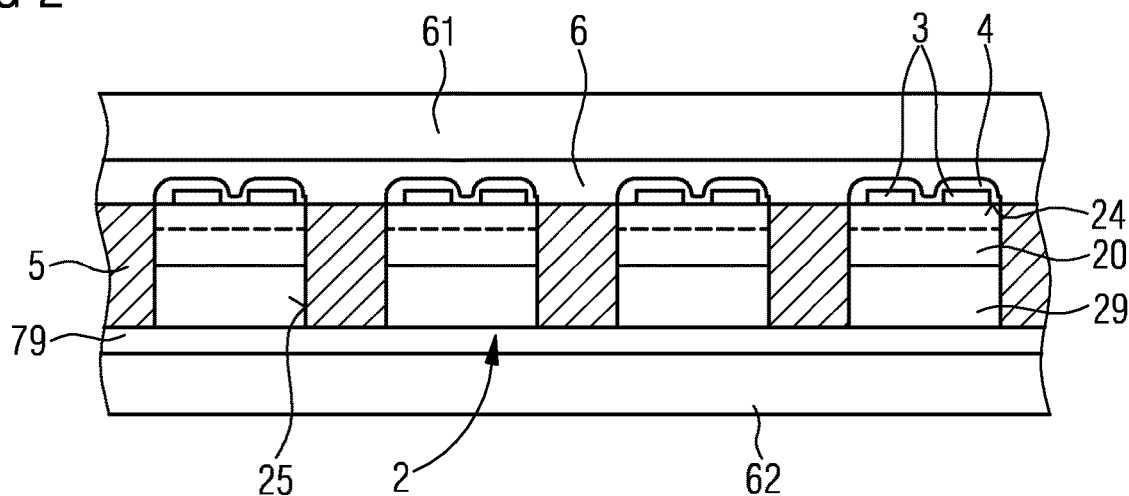

LIST OF REFERENCE SIGNS 1 optoelectronic semiconductor device
2 semiconductor chip
20 semiconductor layer sequence
22 active layer
24 mounting face
25 side face
29 wafer/substrate
3 electrical contact pad
4 protective layer
40 aqueous solution
5 casting body
6 mold film
61 first mold part
62 second mold part
7 luminescent material layer
71 liner sheet
72 thermal release tape
73 intermediate carrier
78 wafer ring
79 wafer blue tape
81 carrier
82 electrical contact areas
83 solder

DETAILED DESCRIPTION

Our method produces optoelectronic semiconductor devices. Preferably, the produced optoelectronic semiconductor devices are light-emitting diodes, LEDs for short. In particular, the finished optoelectronic semiconductor devices are to produce visible light such as blue light and/or white light.

The method may comprise the step of providing a semiconductor layer sequence on the wafer, in particular on a transparent wafer. For example, the wafer is a sapphire wafer. The semiconductor layer sequence preferably includes at least one active layer such as a multi-quantum well structure, MQW for short.

A semiconductor material of the semiconductor layer sequence is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, wherein each of $0 \leq n \leq 1$, $0 \leq m \leq 1$ and $m+n \leq 1$ applies. The semiconductor material may in this example additionally comprise a significant quantity of admixed boron and also dopants. For simplicity's sake, however, only the essential constituents of the crystal lattice of the semiconductor material are indicated, i.e., B, Al, As, Ga, In, N and/or P, even if they may in part be replaced and/or supplemented by small quantities of further substances. Preferably, the semiconductor layer sequence is based on the material system InGaAlN.

The method may include the step of applying electrical contact pads on a mounting face of the semiconductor layer sequence. For example, the contact pads are soldered or adhered on a mount such as a printed circuit board and/or a heatsink. In particular, the contact pads are designed for surface-mounting the finished optoelectronic semiconductor device. Thus, the optoelectronic semiconductor device can be a surface mount device, SMD for short. Preferably, the electrical contact pads are made from one or from a plurality of metals. For example, the contact pads comprise a plurality of metal layers composed of one or of more metals.

The method may comprise the step of coating the semiconductor layer sequence at the mounting face and/or on the electrical contact pads with a protective layer. In particular, the complete mounting face and the complete contact pads are coated with the protective layer. That is, the protective layer can form a continuous and uninterrupted layer that completely covers the semiconductor layer sequence as well as the electrical contact pads.

The method may comprise the step of dicing the semiconductor layer sequence and the wafer to form semiconductor chips. The semiconductor chips comprise side faces. The dicing is done, for example, by laser radiation, in particular by stealth dicing. Otherwise, the dicing can be done by sawing and/or scribing and breaking.

The method may comprise the step of forming a casting body. Preferably, the casting body is formed all around the semiconductor chips when seen in a top view. In particular, all the side faces of the semiconductor chips are directly covered by a material of the casting body, for example, completely covered.

The protective layer may have anti-wetting properties towards the material of the casting body. That is, creeping of the material of the casting body onto the protective layer is inhibited or prevented. For example, if the material of the casting body is a hydrophilic material, then the protective layer can have hydrophobic properties. Otherwise, if the material of the casting body is hydrophobic, the protective layer can have hydrophilic properties. Hence, by the protective layer it is possible that in particular the mounting face and the electrical contact pads remain free of the material of the casting body.

The method may comprise the step of dicing the casting body to the optoelectronic semiconductor devices. Dicing the casting body can be performed by sawing or cutting or also by a laser process. With the dicing of the casting body, the separated optoelectronic semiconductor devices can be produced and/or finished. Each one of the finished optoelectronic semiconductor devices comprises one or a plurality of the semiconductor chips.

The protective layer may still be present in the finished optoelectronic semiconductor devices on the mounting face and/or on the electrical contact pads. That is, it is not necessary to remove the protective layer from the semiconductor layer sequence and/or the contact pads during the method of producing the optoelectronic semiconductor devices.

The method may produce optoelectronic semiconductor devices and comprises the following method steps, preferably in the stated order:

A) providing a semiconductor layer sequence on a transparent wafer, the semiconductor layer sequence including an active layer,
B) applying electrical contact pads on a mounting face of the semiconductor layer sequence,
C) coating the semiconductor layer sequence at the mounting face and/or on the electrical contact pads with a protective layer,
D) dicing the semiconductor layer sequence and the wafer to form semiconductor chips with side faces,
E) forming a casting body all around the semiconductor chips directly on the side faces, the protective layer having anti-wetting properties towards a material of the casting body, and
F) dicing the casting body to the optoelectronic semiconductor devices, wherein the protective layer is still on the mounting face and/or on the electrical contact pads in the finished optoelectronic semiconductor devices.

Chip scale package LEDs can be produced using a reverse process flow. That means that a white reflective wall is formed around a flip chip while the electrical contact pads are facing up. However, this process flow suffers from a comparably high yield loss because material of the casting body can creep onto the contact pads. Defect devices can be screened out during initial inspection. However, there is still a risk of quality problems occurring, in particular soldering problems, during the assembly processes if any devices where material of the casting body has crept onto the electrical contact pads are delivered to a user.

With our method, such creeping of material of the casting body onto the contact pads can be prevented due to the protective layer, which is preferably a hydrophobic layer formed on the mounting face prior to forming the casting body. Hence, yield can be increased and reliability of the devices during soldering on the downstream side can also be increased.

In step C) the complete mounting face and all the electrical contact pads may be completely coated with the protective layer which is still present in the finished optoelectronic semiconductor devices at least on all the electrical contact pads and, as an option, also on the remaining parts of the mounting surface of the semiconductor layer sequence. That is, the protective layer can form a contiguous layer in the finished product on the mounting face and over the electrical contact pads. These devices with the protective layer on the electrical contact pads are preferably ready for mounting, in particular for soldering. Hence, there is no need to remove the protective layer before mounting of the finished optoelectronic semiconductor devices.

In method step C), the feature that the complete mounting face and/or the electrical contact pads are coated with the protective layer may be limited to the electrical contact pads in the finished optoelectronic semiconductor devices. That is, the material for the protective layer can be removed from the semiconductor layer sequence or essentially removed from the semiconductor layer sequence. For example, the material or the protective layer shows good adhesion only to the metal of the contact pads but not to the semiconductor material or to a passivation layer applied to the semiconductor material of the semiconductor layer sequence.

The protective layer may be a hydrophobic layer. As an alternative, the protective layer can be a hydrophilic layer.

The material of the casting body may be a silicone or an epoxide or a silicone-epoxide hybrid material. In particular, the material of the casting body is a matrix material for metal oxide particles dispersed into the matrix material. For example, the metal oxide particles are titanium dioxide particles. Thus, the casting body can have a transparent matrix material and reflective particles therein. Preferably, the casting body appears white to an observer.

The protective layer may be made from at least one of a phosphorous organic compound, a phosphorous salt, a methane sulfonic acid, a polysiloxane.

The protective layer may be applied by spraying a liquid in step C). Preferably, the liquid is dried after the spraying of the protective layer.

The protective layer may be applied as an aqueous solution. For example, a concentration of a material for the protective layer in the aqueous solution is at least 1 g/l or 5 g/l and/or at most 50 g/l or 25 g/l or 15 g/l.

The aqueous solution may be dried after being applied at an elevated temperature. The temperature for drying is, for example, at least 75° C. or 95° C. and/or at most 200° C. or 160° C. or 140° C.

For example, the protective layer is made from an aqueous solution as specified in US 2011/0281124 A1, the subject matter of which is incorporated herein by reference.

Otherwise, the protective layer can be made from an aqueous composition as specified in US 2011/0189481 A1, the subject matter of which is incorporated herein by reference.

Preferably, the protective layer is made from Post Dip SN260, Protectostan LF or Protectostan Ultra New 2-in-1 tin post dip, from Atotech Deutschland GmbH.

The finished protective layer may be comparably thin. For example, a thickness of the protective layer amounts to at most 0.1 μm or 20 nm or 10 nm after step C) is completed. As an alternative or in addition, the thickness of the protective layer is at least 1 nm or 5 nm or 10 nm.

The casting body may be produced in step E) by casting, in particular by pressureless casting. That is, the material for the casting body is just filled in a cavity like a trough in which the semiconductor chips are located. Then, for example, the trough is filled up by rinsing with the material for the casting body until the material terminates flush with the mounting faces of the semiconductor chips. That is, it is not necessary to form the casting body with increased pressure as is, for example, in compression molding.

The casting body may be produced in step E) by a molding using an increased pressure like film-assisted molding. It is thus possible to use a mold film wherein the electrical contact pads can be pressed completely or in part into the mold film during application of the material for the casting body.

The element contact pads may be made from at least one of the following metals at least at a side remote from the semiconductor layer sequence: silver, gold, chromium, copper, nickel, palladium, platinum, tin, zinc.

The wafer for the semiconductor layer sequence may be made of sapphire and the semiconductor layer sequence may be based on AlInGaN. Preferably, the finished semiconductor chips are fashioned as light-emitting diode flip chips emitting blue light.

The method may further comprise a step G). Step G) preferably follows step E) and preferably precedes step F). In step G) a contiguous luminescent material layer is applied to the casting body and/or to the diced wafer. It is possible that the luminescent material layer is also diced in method step F).

In method step G), the luminescent material layer may be arranged on a liner sheet and on a thermal release tape and on an intermediate carrier. The mentioned components preferably follow in this order, preferably directly on each other and/or in a direction away from the semiconductor layer sequence.

The luminescent material layer preferably comprises a luminescent material or a lumenescent material mixture selected from the following materials: $Eu^{2+}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$; garnets from the general system $(Gd,Lu,Tb,Y)_3(Al,Ga,D)_5(O,X)_{12}$:RE with X=halide, N or divalent element, D=tri- or tetravalent element and RE=rare earth metals such as $Lu_3(Al_{1-x}Ga_x)_5O_{12}:Ce^{3+}$, $Y_3(Al_{1-x}Ga_x)_5O_{12}:Ce^{3+}$; $Eu^{2+}$-doped sulfides such as $(Ca,Sr,Ba)S:Eu^{2+}$; $Eu^{2+}$-doped SiONs such as $(Ba,Sr,Ca)Si_2O_2N_2:Eu^{2+}$; SiAlONs for instance from the system $Li_xM_yLn_zSi_{12-(m+n)}Al_{(m+n)}O_nN_{16-n}$; beta-SiAlONs from the system $Si_{6-x}Al_zO_yN_{8-y}:RE_z$; nitrido-orthosilicates such as $AE_{2-x-a}RE_xEu_aSiO_{4-x}N_x$, $AE_{2-x-a}RE_xEu_aSi_{1-y}O_{4-x-2y}N_x$ with RE=rare earth metal and AE=alkaline earth metal; orthosilicates such as $(Ba,Sr,Ca,Mg)_2SiO_4:Eu^{2+}$; chlorosilicates such as $Ca_8Mg(SiO_4)_4Cl_2:Eu^{2+}$; chlorophosphates such as $(Sr,Ba,Ca,Mg)_{10}(PO_4)_6Cl_2:Eu^{2+}$; BAM lumenescent materials from the BaO—MgO—$Al_2O_3$ system such as $BaMgAl_{10}O_{17}:Eu^{2+}$; halophosphates such as $M_5(PO_4)_3(Cl,F):(Eu^{2+},Sb^{3+},Mn^{2+})$; SCAP luminescent materials such as $(Sr,Ba,Ca)_5(PO_4)_3Cl:Eu^{2+}$. The luminescent materials disclosed in EP 2 549 330 A1 may also be used as luminescent materials. With regard to the luminescent materials used, that subject matter is incorporated herein by reference. "Quantum dots" may moreover also be introduced as converter material. Quantum dots in the form of nanocrystalline materials which contain a group II-VI compound and/or a group III-V compound and/or a group IV-VI compound and/or metal nanocrystals, are preferred.

Moreover, an optoelectronic semiconductor device is provided. The optoelectronic semiconductor device is preferably produced with a method as described in one or more examples as listed above. For this reason, features of the method are also disclosed for the optoelectronic semiconductor device and vice versa.

The optoelectronic semiconductor device may comprise a substrate which is a piece of the diced wafer. The semiconductor layer sequence on the substrate may include the active layer to preferably produce ultraviolet and/or visible radiation. The semiconductor layer sequence together with the substrate may form the semiconductor chip. The electrical contact pads may be located on the mounting face of the semiconductor layer sequence on a side remote from the substrate. The protective layer, which is preferably a hydrophobic layer, may be limited to the mounting face and/or to the electrical contact pads. The casting body may be formed all around the semiconductor chip and directly touch the side faces of the semiconductor chip. The protective layer may have anti-wetting properties towards the material of the casting body. Thus, the mounting face and/or the electrical contact pads can remain free of the material of the casting body.

The method and optoelectronic semiconductor device are explained in greater detail below by way of examples with reference to the drawings. Elements which are the same in the individual figures are indicated with the same reference numerals. The relationships between the elements are not shown to scale, however, but rather individual elements may be shown exaggeratedly large to assist in understanding.

In FIG. 1, a method of producing optoelectronic semiconductor devices 1 is illustrated. According to FIG. 1A, a semiconductor layer sequence 20 comprises an active layer 22 and grown onto a wafer 29 is provided. The wafer 29 is preferably a sapphire substrate. The semiconductor layer sequence 20 is preferably based on AlInGaN. The semiconductor layer sequence 20 has a mounting face 24 on a side remote from the wafer 29. According to FIG. 1A, the semiconductor layer 20 is contiguous and not yet structured.

FIG. 1B shows that electrical contact pads 3 are applied to the semiconductor layer sequence 20 at the mounting face 24. The contact pads 3 are designed for surface-mounting the finished semiconductor devices 1. The semiconductor layer sequence 20 is not yet structured or singulated, but the areas for the later semiconductor chips 2 are indicated by dashed lines.

In particular, the contact pads 3 are made of a sequence of at least two or at least three metal layers, not explicitly shown. For example, in a direction away from the semiconductor layer sequence 20, the electrical contact pads 3 comprise a titanium or palladium layer followed by a gold or gold tin layer and optionally followed by a thin layer of gold.

As an option, as in all of the other examples, the wafer 29 can be applied on a wafer blue tape 79. As an alternative or in addition, a wafer ring 78 can be provided all around the wafer 29.

FIG. 1C shows that an aqueous solution 40 is applied to the semiconductor layer sequence and to the electrical contact pads 3. The aqueous solution 40 completely covers the semiconductor layer sequence 20. The aqueous solution 40 is dried to form a contiguous protective layer 4. Preferably, the protective layer 4 is made from Protectostan Ultra New 2-in-1 tin post dip or from Protectostan LF from the German manufacturer Atotech Deutschland GmbH.

According to the method step as illustrated in FIG. 1D, the semiconductor layer sequence 20 and the wafer 29 are diced to form semiconductor chips 2. Side faces 25 of the semiconductor chips 2 are free of the protective layer as singulation to the semiconductor chips 2 follows the application and drying of the protective layer 4.

FIG. 1E illustrates that a casting body 5 is formed. For example, the casting body 5 is formed by rinsing a material of the casting body 5 into the wafer ring 78. As an alternative, a different mold form can be used to produce the casting body 5.

Preferably, the casting body 5 is made of a silicone in which titanium dioxide particles are embedded so that the finished casting body 5 appears white to an observer.

The finished optoelectronic semiconductor device 1 is illustrated in FIG. 1F. The casting body 5 completely and directly covers the side faces 25. The singulated wafer forms a substrate 29 in the semiconductor device 1. A side of the substrate 29 facing away from the semiconductor layer sequence 20 is free of the protective layer 4 as well as of the casting body 5. When in operation, light is emitted by the semiconductor device 1 through the substrate 29.

With the protective layer present on the electric contact pads, the deposited metal becomes water-repellent because of the hydrophobic protective layer. Thus, the protective layer serves as a rinse aid that effects a fast and easy drying of the contact pads 3. Thus, the material for the casting body 5 can be prevented from creeping onto the contact pads 3 during manufacturing of the semiconductor device 1.

At the same time, solderability of the contact pads 3 is not deteriorated and thus the contact pads 3 in the finished semiconductor device 1 are still wettable by molten metal alloys like solders. The protective layer described here forms a very stable layer on the mounting face 24. Even after long-term storage, annealing at 150° C. and multiple reflow operations, the protective layer 4 is still present on the mounting face 24 and on the contact pads 3. Thus, the protective layer 4 is still effective even after assembly of the semiconductor device 1 onto a carrier 81.

In a method step between FIGS. 1D and 1E, not shown, it is possible to expand a distance between the singulated semiconductor chips 2. This can be realized, for example, by stretching the wafer blue tape. With such an increased distance between adjacent semiconductor chips 2, dicing through the casting body 5 after the method step of FIG. 1E is enabled. Other than shown, it is also possible to pick the semiconductor chips 2 after the method step of FIG. 1D and to place the semiconductor chips 2 onto an intermediate carrier on which the casting body 5 is formed, not shown.

FIG. 2 illustrates a method step as an alternative to FIG. 1E. According to FIG. 2, the casting body 5 is formed by film-assisted molding, FAM for short. Thus, the contact pads 3, with the protective layer 4 on them are pressed into a mold film 6 which is located on a first mold part 61. As an option, the wafer blue tape 79 is still present and can be located on a second mold part 62. The material for the casting body 5 can be introduced with pressure to form the casting body 5.

Figure 3:
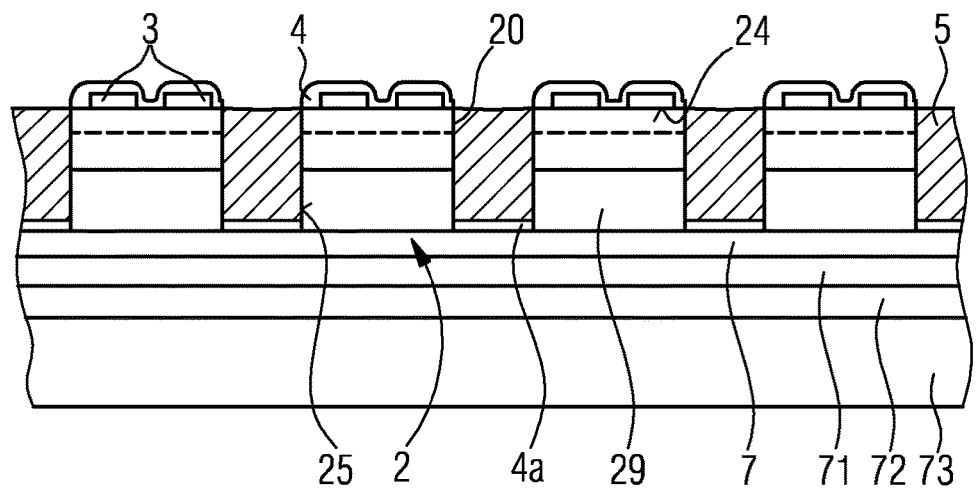

In FIG. 3, another alternative to the method step of FIG. 1E is illustrated. The semiconductor chips 2 are placed onto a continuous luminescent material layer 7 located on a liner sheet 71, a thermal release tape 72 and an intermediate carrier 73 which is, for example, a stainless steel plate. The material for the casting body 5 is filled in between the semiconductor chips 2 to form the casting body 5. As an option, it is not necessary that the casting body 5 has a plane top side remote from the luminescent material layer 7 but can form a meniscus.

It is possible that there is a connecting layer like an adhesive or glue between the luminescent material layer 7 and the substrates 29, not shown.

Placing the semiconductor chips 2 onto the luminescent material layer 7 can follow the method step of FIG. 1D. As an alternative, the protective layer 4 can be applied to the semiconductor layer sequence 20 just after placing the semiconductor chips 2 onto the luminescent material layer 7. In this example it is possible that part of the protective layer 4a is located on the luminescent material layer 7 between adjacent semiconductor chips 2. However, the side faces 25 remain free of the protective layer 4. The luminescent material layer 7 can be diced in the same step with the casting body 5 analogous as is illustrated in connection with FIG. 1F.

Figure 4:
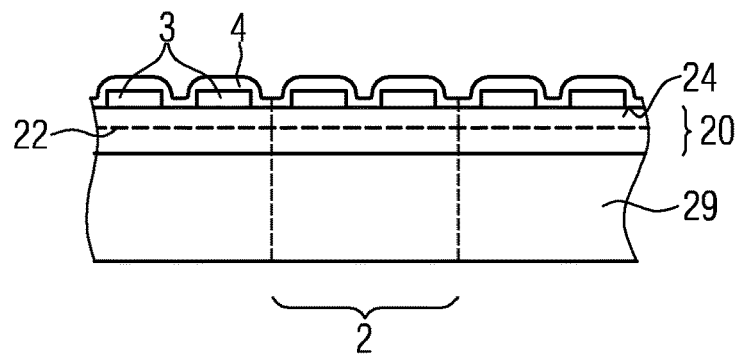
Figure 4:
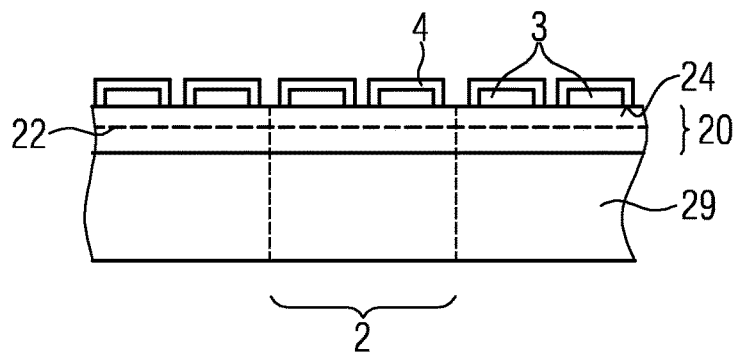

FIG. 4 illustrates that the protective layer 4 is first formed as a continuous layer as shown particularly in FIG. 4A.

In the further method step as shown in FIG. 4B, it is possible that the protective layer 4 can be limited to the contact pads 3. This can be done, for example, by a washing step so that the material for the protective layer 4 is washed away from the semiconductor layer sequence 20. In this example, the material for the protective layer 4 shows an increased adhesion to the contact pads compared with the remaining mounting face 24.

The method step of FIG. 4A is an option so that it is possible that the material for the protective layer 4 is applied only to the contact pads 3, for example, by printing so that no material for the protective layer 4 has to be removed afterwards.

Figure 5:
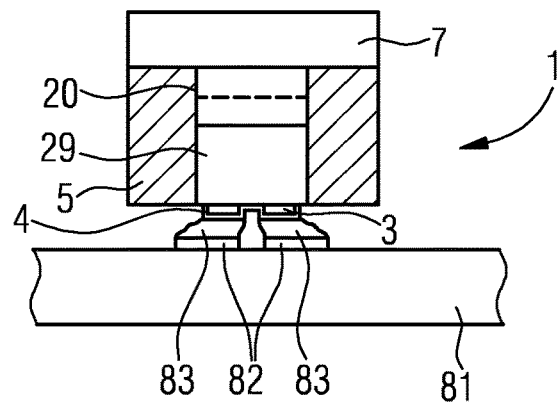
FIG. 5 is a schematic representation of an example of an optoelectronic semiconductor device mounted on a carrier.

In FIG. 5, the semiconductor device 1 mounted onto the carrier 81 is shown. The carrier 81 comprises electrical contact areas 82 to which the semiconductor device 1 is electrically and also mechanically connected. This connection is done by a solder 83. As can be seen from FIG. 5, the soldering is not influenced or not significantly influenced by the presence of the protective layer 4 located on the contact pads 3.

Figure 6:
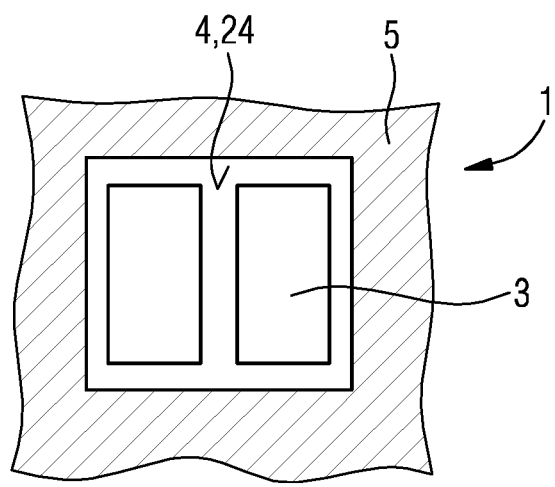
FIGS. 6A and 6B are schematic top views of an example and a non-exemplary configuration of an optoelectronic semiconductor device.
Figure 6:
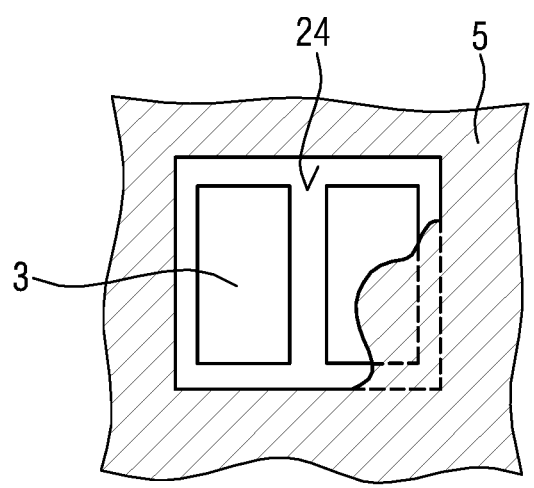

The effect of the protective layer 4 is illustrated in the top views of FIG. 6. According to FIG. 6A, the protective layer 4 is present. Hence, the casting body 5 is limited to areas beside the mounting face 24. Thus, the contact pads 3 are free of a material of the casting body 5 and can be soldered without any problems.

Contrary to that, in FIG. 6B, the protective layer 4 is missing. For this reason, there is an increased risk that the material for the casting body 5 also covers the mounting face 24 and the contact pads 3 at least in part. As devices as illustrated in FIG. 6B cannot be used, by the protective layer 4 a yield of the method is increased.

Our methods and devices are not not restricted to the examples by the description on the basis of the examples. Rather, this disclosure encompasses any new feature and also any combination of features, which in particular comprises any combination of features in the appended claims and any combination of features in the examples, even if the feature or combination itself is not explicitly specified in the claims or examples.

The invention claimed is:

1. A method of producing optoelectronic semiconductor devices comprising in the stated order:
   A) providing a semiconductor layer sequence on a transparent wafer, the semiconductor layer sequence including an active layer;
   B) applying electrical contact pads on a mounting face of the semiconductor layer sequence;
   C) coating the semiconductor layer sequence at the mounting face and/or on the electrical contact pads with a protective layer;
   D) dicing the semiconductor layer sequence and the wafer to form semiconductor chips with side faces;
   E) forming a casting body all around the semiconductor chips directly on the side faces, the protective layer having anti-wetting properties towards a material of the casting body; and
   F) dicing the casting body to form the finished optoelectronic semiconductor devices, wherein the protective layer remains on the mounting face and/or on the electrical contact pads in the finished optoelectronic semiconductor devices.

2. The method according to claim 1, wherein, in C), the complete mounting surface and all the electrical contact pads are coated with the protective layer still present in the finished optoelectronic semiconductor devices at least on all the electrical contact pads.

3. The method according to claim 1, wherein, in C), the complete mounting surface and all the electrical contact pads are coated with the protective layer, and the protective layer is limited in the finished optoelectronic semiconductor devices to the electrical contact pads.

4. The method according to claim 1, wherein the protective layer is a hydrophobic layer and the material of the casting body is a silicone as a matrix material for metal oxide particles.

5. The method according to claim 1, wherein the protective layer is made from at least one of a phosphorous organic compound, a phosphorous salt, a methane sulfonic acid, and a polysiloxane.

6. The method according to claim 1, wherein the protective layer is applied by spraying a liquid in C), and said liquid is dried to form the protective layer.

7. The method according to claim 1,
   wherein the protective layer is applied as an aqueous solution, a concentration of a material for the protective layer in the aqueous solution is at least 1 g/l and at most 25 g/l, and
   the aqueous solution is dried after being applied at a temperature of 75° C. and 160° C.

8. The method according to claim 1, wherein a thickness of the protective layer amounts to at most 20 nm after C) is completed.

9. The method according to claim 1, wherein the casting body is produced in E) by film assisted molding with a mold film, and the electrical contact pads are pressed into the mold film during application of the material of the casting body, or by pressureless casting.

10. The method according to claim 1, wherein the electrical contact pads are made of at least one metal at a side remote from the semiconductor layer sequence: Ag, Au, Cr, Cu, Ni, Pd, Pt, Sn, and Zn.

11. The method according to claim 1, wherein the wafer is made of sapphire, the semiconductor layer sequence is based on AlInGaN, and the finished semiconductor chips are light-emitting diode flip chips emitting blue light.

12. The method according to claim 1, further comprising G) following E) and preceding F),
   wherein a contiguous luminescent material layer is applied to the casting body and to the diced wafer, and the luminescent material layer is diced in F).

13. The method according to claim 12, wherein, in G), the luminescent material layer is arranged on a liner sheet and on a thermal release tape and on an intermediate carrier, in this order and in a direction away from the semiconductor layer sequence.

14. An optoelectronic semiconductor device produced by the method according to claim 1, comprising:
   a substrate that is part of the diced wafer;
   the semiconductor layer sequence is on the substrate, the semiconductor layer sequence includes the active layer to produce ultraviolet or visible radiation, the semiconductor layer sequence and the substrate together form the semiconductor chips;
   the electrical contact pads on the mounting face of the semiconductor layer sequence are remote from the substrate;
   a hydrophobic protective layer is limited to the mounting face and/or to the electrical contact pads;
   the casting body is all around the semiconductor chips and directly on the side faces of the semiconductor chips, and the protective layer has anti-wetting properties towards the material of the casting body.

* * * * *